United States Patent

Uehara

[11] Patent Number: 5,854,798
[45] Date of Patent: Dec. 29, 1998

[54] MULTIRATE GENERATOR AND MULTIRATE GENERATING METHOD

[75] Inventor: Takafumi Uehara, Tokyo, Japan

[73] Assignee: Ando Electric Co., Ltd., Tokyo, Japan

[21] Appl. No.: 14,263

[22] Filed: Jan. 27, 1998

[51] Int. Cl.$^6$ .................................................. G06F 11/00
[52] U.S. Cl. ........................................................ 371/27.1
[58] Field of Search ............................... 371/27.1, 22.1, 371/22.5, 28; 295/558, 555, 825

[56] References Cited

U.S. PATENT DOCUMENTS

| | | | |
|---|---|---|---|
| 5,754,837 | 5/1998 | Walsh et al. | 395/555 |
| 5,757,794 | 5/1998 | Young | 395/287 |

Primary Examiner—Vincent P. Canney
Attorney, Agent, or Firm—Pillsbury Madison & Sutro LLP

[57] ABSTRACT

A multirate generator for generating a rate signal and a multirate signal having a subrate period and a subrate number which are set for each period of the rate signal, which comprises a rate signal generation unit, a multirate signal generation unit, and a multirate number detection unit. The multirate generator operates the rate signal generation unit and the multirate generation unit by means of the same clock and makes the rate signal generation unit and the multirate generation unit generate, respectively, a rate signal and a multirate signal, to generate a rate signal and a multirate signal which have been timing-adjusted without delay elements and the like, and without requiring a timing adjustment. The rate data, multirate data and multirate number data may be optionally set, to enable outputting a desired rate signal and a desired multirate signal.

8 Claims, 3 Drawing Sheets

MULTIRATE GENERATOR AND MULTIRATE GENERATING METHOD

BACKGROUND OF THE INVENTION

1. Field of the Invention

The present invention relates to a multirate generator and a multirate generating method, in particular, to a multirate generator and a multirate generating method, which are used in an IC tester and the like and generate a rate signal having a desired period according to a rate data and generate a multirate signal having a desired subrate period according to a multirate data and a desired subrate number (pulse number) according to multirate number data, for each period of such a rate signal.

2. Description of Related Art

Up to now a multirate generator having a circuit arrangement, as shown in FIG. 3, for example, is known as a multirate generator for generating a rate signal and a multirate signal.

The multirate generator 2 shown in FIG. 3 comprises a rate signal generation unit 11, a multirate signal generation unit 12, a multirate number detection unit 13, and delay elements 14 and 15.

The rate signal generation unit 11 is composed of a first counter 3 and a first detection circuit 4, and outputs a rate signal 26 through the delay element 14 on the basis of inputted rate data 23.

The first counter 3 has a mode set by a load signal 31 inputted to an SEL terminal from the first detection circuit 4, and has a load mode set in case that the inputted load signal 31 is at level "H" and has a count mode set in case that the inputted load signal 31 is at level "L". That is to say, the first counter 3 loads the rate data 23 in a load mode, and in a count mode, counts down the loaded rate data 23 on the basis of the timing of a clock 24A and outputs the obtained a count value to the first detection circuit 4.

In case of detecting that the output of the first counter 3 has become "0", the first detection circuit 4 comes to be at level "H" for a predetermined period and outputs a load signal 31 to the first counter 3 in order to load the next rate data 23. And the load signal 31 is timing-adjusted through the delay element 14 for synchronizing it with a multirate signal 25 and is outputted as a rate signal 26.

The multirate number detection unit 13 is composed of a third counter 9 and a third detection circuit 10, and outputs a mask signal 33 on the basis of a multirate number data 21.

The third counter 9 has a mode set by a load signal 31 inputted to an SEL terminal through the delay element 15 from the first detection circuit 4, and has a load mode set in case that the inputted load signal 31 is at level "H" and has a count mode set in case that the inputted load signal is at level "L". That is to say, the third counter 9 loads multirate number data 21 in a load mode, and in a count mode, counts down the loaded multirate number data 21 on the basis of the multirate signal 25 outputted from an AND gate 8 of the multirate signal generation unit 12 and outputs the obtained count value to the third detection circuit 10.

The third detection circuit 10 outputs a mask signal 33 which comes to be at level "L" in case of detecting that the output of the third counter 9 has become "0" to the AND gate 8 of the multirate signal generation unit 12.

The multirate signal generation unit 12 is composed of a second counter 5, a second detection circuit 6, an OR gate 7 and the AND gate 8, and generates a multirate signal 25 on the basis of inputted multirate signal 22 and a mask signal 33.

The second counter 5 has a mode set by a multirate signal 25 inputted to an SEL terminal through the AND gate 8, and has a load mode set in case that the inputted multirate signal 25 is at level "H" and has a count mode set in case that the multirate signal 25 is at level "L". That is to say, the second counter 5 loads multirate data 22 in a load mode, and in a count mode, counts down the loaded multirate data 22 on the basis of a clock 24B and outputs the obtained count value to the second detection circuit 6.

The second detection circuit 6 outputs to the OR gate 7 a signal which comes to be at level "H" for a predetermined period in case of detecting that the output of the second counter 5 has become "0".

The OR gate 7 makes the OR of a signal inputted from the second detection circuit 6 and a load signal 31 which is outputted from the first detection circuit 4 and is timing-adjusted by the delay element 15, and outputs the obtained OR signal 32 to the AND gate 8. The AND gate 8 makes the AND of the inputted OR signal 32 and a mask signal 33 inputted from the multirate number detection unit 13, and outputs the AND to the outside as a multirate signal 25. This multirate signal 25 is outputted to an SEL terminal of the second counter 5 in order to load the next multirate data and to the third counter 9 of the multirate number detection unit 13 in order to detect a pulse number. That is to say, when the pulse number of the OR signal 32 inputted from the OR gate 7 becomes the multirate number data 21, the AND gate 8 masks the OR signal 32 with a mask signal 33 and outputs a multirate signal 25 having a subrate number (pulse number) corresponding to the multirate number data.

However, in a multirate generator shown in FIG. 3 since the rate signal generation unit 11 and the multirate signal generation unit 12 are operated independently of each other by different clocks, that is, clocks 24A and 24B, the output of the rate generation unit 13 and the output of the multirate generation unit 12 are different in timing from each other, and so it has been necessary to make adjustment by means of the delay elements 14 and 15 in order to synchronize both of them with each other. As a result, since delay elements used for timing adjustment are needed, there is a problem that the apparatus becomes high in cost.

SUMMARY OF THE INVENTION

The present invention was developed in view of these problems.

An object of the invention is to provide a multirate generator and a multirate generating method which are able to generate a multirate signal at a low cost without requiring a timing adjustment.

That is, in accordance with one aspect of the invention, the multirate generator for generating a rate signal and a multirate signal having a subrate period and a subrate number which are set for each period of the rate signal, comprises: a rate signal generation unit which takes the rate signal as a mode selection input, and in a load mode, counts down rate data to specify a period with which the rate signal is to be generated on the basis of a timing of an inputted clock, and generates a rate signal which comes to be at a predetermined level each time an obtained first count value becomes a predetermined value; a multirate signal generation unit which takes the multirate signal as a mode selection input, and in a load mode, counts down multirate data to specify a subrate period with which the multirate signal is to be generated on the basis of a timing of the inputted clock, outputs a detection signal by detecting that an obtained second count value becomes a predetermined value, makes the OR signal of the detection signal and the rate signal, and generates the multirate signal obtained by masking the OR signal with a mask signal; and a multirate number detection unit which takes the rate signal as a mode selection input, and in a load mode, counts down multirate number data to specify a multirate number of the multirate signal to be generated on the basis of a timing of the multirate signal, detects that an obtained third count value becomes a predetermined value, and outputs the detection signal as the mask signal.

That is to say, according to the above-mentioned composition, in a multirate generator for generating a rate signal and a multirate signal having a subrate period and a subrate number which are set for each period of the rate signal, the rate signal generating means takes a rate signal as a mode selection input, and in a load mode, counts down rate data to specify a period with which the rate signal is to be generated on the basis of the timing of an inputted clock, and generates a rate signal which comes to be at a specified level each time an obtained first count value becomes a specified value; the multirate signal generating means takes a multirate signal as a mode selection input, and in a load mode, counts down multirate data to specify a subrate period with which the multirate signal is to be generated on the basis of the timing of the inputted clock, outputs a detection signal by detecting that an obtained second count value becomes a specified value, makes the OR signal of the detection signal and the rate signal, and generates a multirate signal obtained by masking the OR signal with a mask signal; and the multirate number detecting means takes a rate signal as a mode selection input, and in a load mode, counts down multirate number data to specify a multirate number of the multirate signal to be generated on the basis of the timing of the multirate signal, detects that an obtained third count value becomes a specified value, and outputs it as a mask signal.

Therefore, since this multirate generator operates a rate signal generating means and a multirate signal generating means by means of the same clock, and makes the rate signal generating means and the multirate signal generating means generate, respectively, a rate signal and a multirate signal, it is possible to generate a rate signal and a multirate signal which have been timing-adjusted without using delay elements and the like, and it is possible to provide a low-cost multirate generator requiring no timing adjustment.

In accordance with another aspect of the present invention, the multirate generator for generating a rate signal and a multirate signal having a subrate period and a subrate number which are set for each period of the rate signal, comprises: a first counter which takes the rate signal as a mode selection input, and in a load mode, counts down rate data to specify a period with which the rate signal is to be generated on the basis of a timing of an inputted clock, and outputs an obtained first count value; a first detection circuit which outputs a rate signal which comes to be at a specified level each time the first count value becomes a specified value; a second counter which takes the multirate signal as a mode selection input, and in a load mode, counts down multirate data to specify a subrate period with which the multirate signal is to be generated on the basis of a timing of the inputted clock, and outputs an obtained second count value; a second detection circuit which detects that the second count value becomes a specified value and outputs it as a detection signal; an OR gate which makes and outputs an OR signal of the detection signal and the rate signal; an AND gate which makes an AND of the OR signal and a mask signal and outputs it as the multirate signal; a third counter which takes the rate signal as a mode selection input, and in a load mode, counts down multirate data to specify a subrate number of the multirate signal to be generated on the basis of a timing of the multirate signal, and outputs an obtained third count value, and a third detection circuit which detects that the third count value becomes a predetermined value and outputs it as the mask signal.

That is to say, according to the above-mentioned composition, in a multirate generator for generating a rate signal and a multirate signal having a subrate period and a subrate number which are set for each period of the rate signal, the first counter means takes a rate signal as a mode selection input, and in a load mode, counts down rate data to specify a period with which the rate signal is to be generated on the basis of the timing of an inputted clock, and outputs an obtained first count value; the first detecting means outputs a rate signal which comes to be at a specified level each time the first count value becomes a specified value; the second counter means takes a multirate signal as a mode selection input, and in a load mode, counts down multirate data to specify a subrate period with which the multirate signal is to be generated on the basis of the timing of the inputted clock, and outputs an obtained second count value; the second detecting means detects that the second count value becomes a specified value and outputs it as a detection signal; the OR gate makes and outputs the OR signal of a detection signal and a rate signal; the AND gate makes the AND of an OR signal and a mask signal and outputs it as the multirate signal; the third counter means takes a rate signal as a mode selection input, and in a load mode, counts down multirate number data to specify a subrate number of the multirate signal to be generated on the basis of the timing of the multirate signal, and outputs an obtained third count value; and the third detecting means detects that the third count value becomes a specified value, and outputs it as a detection signal.

Therefore, since this multirate generator operates a first counter means for generating a rate signal and a second counter means for generating a multirate signal by means of the same clock, and makes the first detecting means and the second detecting means generate and the like, respectively, a rate signal and a multirate signal, it is possible to generate a rate signal and a multirate signal which have been timing-adjusted with a simple circuitry and without using delay elements, and it is possible to provide a low-cost multirate generator of simple circuitry requiring no timing adjustment.

In this case, the multirate generator according to the invention may be composed so as to make it possible to optionally set the rate data, the multirate data and the multirate number data.

Accordingly, since this multirate generator makes it possible to optionally set rate data, multirate data and multirate number data, in addition to the effects of the invention as described above, it is possible for an operator to set optionally the period of a rate signal, and the subrate period and the subrate number of a multirate signal, and output a desired rate signal and a desired multirate signal.

In accordance with another aspect of the present invention, the multirate generating method for generating a rate signal and a multirate signal having a subrate period and a subrate number which are set for each period of the rate signal, the multirate generating method comprises the steps of: taking the rate signal as a mode selection input, and in a load mode, counting down rate data to specify a period with which the rate signal is to be generated on the basis of a timing of an inputted clock, and generating a rate signal which comes to be at a predetermined level each time an obtained first count value becomes a predetermined value; taking the rate signal as a mode selection input, and in a load mode, counting down multirate number data to specify a subrate number of the multirate signal to be generated on the basis of a timing of the multirate signal, detecting that an obtained third count value becomes a predetermined value, and outputting it as a mask signal; and taking the multirate signal as a mode selection input, and in a load mode, counting down multirate data to specify a subrate period with which the multirate signal is to be generated on the basis of a timing of the inputted clock, outputting a detection signal by detecting that an obtained second count value becomes a predetermined value, making an OR signal of the detection signal and the rate signal, making an AND of the OR signal and the mask signal, and generating it as the multirate signal.

According to the above-mentioned composition, the multirate generating method for generating a rate signal and a multirate signal having a subrate period and a subrate number which are set for each period of the rate signal: takes a rate signal as a mode selection input, and in a load mode, counts down rate data to specify a period with which the rate signal is to be generated on the basis of the timing of an inputted clock, and generates a rate signal which comes to be at a specified level each time an obtained first count value becomes a specified value; takes a rate signal as a mode selection input, and in a load mode, counts down multirate number data to specify a subrate number of the multirate signal to be generated on the basis of the timing of the multirate signal, detects that an obtained third count value becomes a specified value, and outputs it as a mask signal; and takes a multirate signal as a mode selection input, and in a load mode, counts down multirate data to specify a subrate period with which the multirate signal is to be generated on the basis of the timing of the inputted clock, outputs a detection signal by detecting that an obtained second count value becomes a specified value, makes the OR signal of the detection signal and the rate signal, makes the AND of the OR signal and a mask signal, and generates it as a multirate signal.

Therefore, since this multirate generating method operates a rate signal generating means and a multirate signal generating means by means of the same clock, and makes them generate, respectively, a rate signal and a multirate signal, it is possible to generate a rate signal and a multirate signal which have been timing-adjusted without using delay elements and the like, and it is possible to provide a low-cost and feasible multirate generating method requiring no timing adjustment.

In accordance with another aspect of the present invention, the multirate generating method for generating a rate signal and a multirate signal having a subrate period and a subrate number which are set for each period of the rate signal, the multirate generating method comprises the steps of: taking the rate signal as a mode selection input, and in a load mode, counting down rate data to specify a period with which the rate signal is to be generated on the basis of a timing of an inputted clock, and outputting an obtained first count value; outputting a rate signal which comes to be at a predetermined level each time the first count value becomes a predetermined value; taking the rate signal as a mode selection input, and in a load mode, counting down multirate number data to specify a subrate number of the multirate signal to be generated on the basis of a timing of the multirate signal, and outputting an obtained third count value; detecting that the third count value becomes a predetermined value and outputting it as a mask signal; taking the multirate signal as a mode selection input, and in a load mode, counting down multirate data to specify a subrate period with which the multirate signal is to be generated on the basis of a timing of the inputted clock, and outputting an obtained second count value; detecting that the second count value becomes a predetermined value and outputting the detection signal; generating and outputting an OR signal of the detection signal and the rate signal; and making the OR of an AND signal and the mask signal and outputting it as the multirate signal.

According to the above-mentioned composition, a multirate generating method for generating a rate signal and a multirate signal having a subrate period and a subrate number which are set for each period of the rate signal, the multirate generating method: takes a rate signal as a mode selection input, and in a load mode, counts down rate data to specify a period with which the rate signal is to be generated on the basis of the timing of an inputted clock, and outputs an obtained first count value; outputs a rate signal which comes to be at a specified level each time the first count value becomes a specified value; takes a rate signal as a mode selection input, and in a load mode, counts down multirate number data to specify a subrate number of the multirate signal to be generated on the basis of the timing of the multirate signal, and outputs an obtained third count value; detects that the third count value becomes a specified value and outputs it as a mask signal; takes a multirate signal as a mode selection input, and in a load mode, counts down multirate data to specify a subrate period with which the multirate signal is to be generated on the basis of the timing of the inputted clock, and outputs an obtained second count value; detects that the second count value becomes a specified value and outputs the detection signal; generates and outputs the OR signal of a detection signal and a rate signal; and makes the OR of an AND signal and a mask signal and outputs it as a multirate signal.

Therefore, since this multirate generating method operates a means for generating a rate signal and a means for generating a multirate signal by means of the same clock, and makes them generate, respectively, a rate signal and a multirate signal, it is possible to generate a rate signal and a multirate signal which have been timing-adjusted with a simple circuitry and without using delay elements, and it is possible to provide a multirate generating method using a low-cost and simple circuitry requiring no timing adjustment.

In this case, the multirate generating method according to the invention may be also composed so as to make it possible to optionally set the rate data, the multirate data and the multirate number data.

Therefore, since this multirate generating method makes it possible to optionally set rate data, multirate data and multirate number data, in addition to the advantageous effects of the invention as described above, it is possible for an operator to set optionally the period of a rate signal, and the subrate period and the subrate number of a multirate signal, and output a desired rate signal and a desired multirate signal.

BRIEF DESCRIPTION OF THE DRAWINGS

The present invention will become more fully understood from the detailed description given hereinbelow and the accompanying drawings which are given by way of illustration only, and thus are not intended as a definition of the limits of the present invention,. and wherein.

PREFERRED EMBODIMENT OF THE INVENTION

An embodiment of the invention will be described in detail with reference to the drawings in the following.

Figure 1:
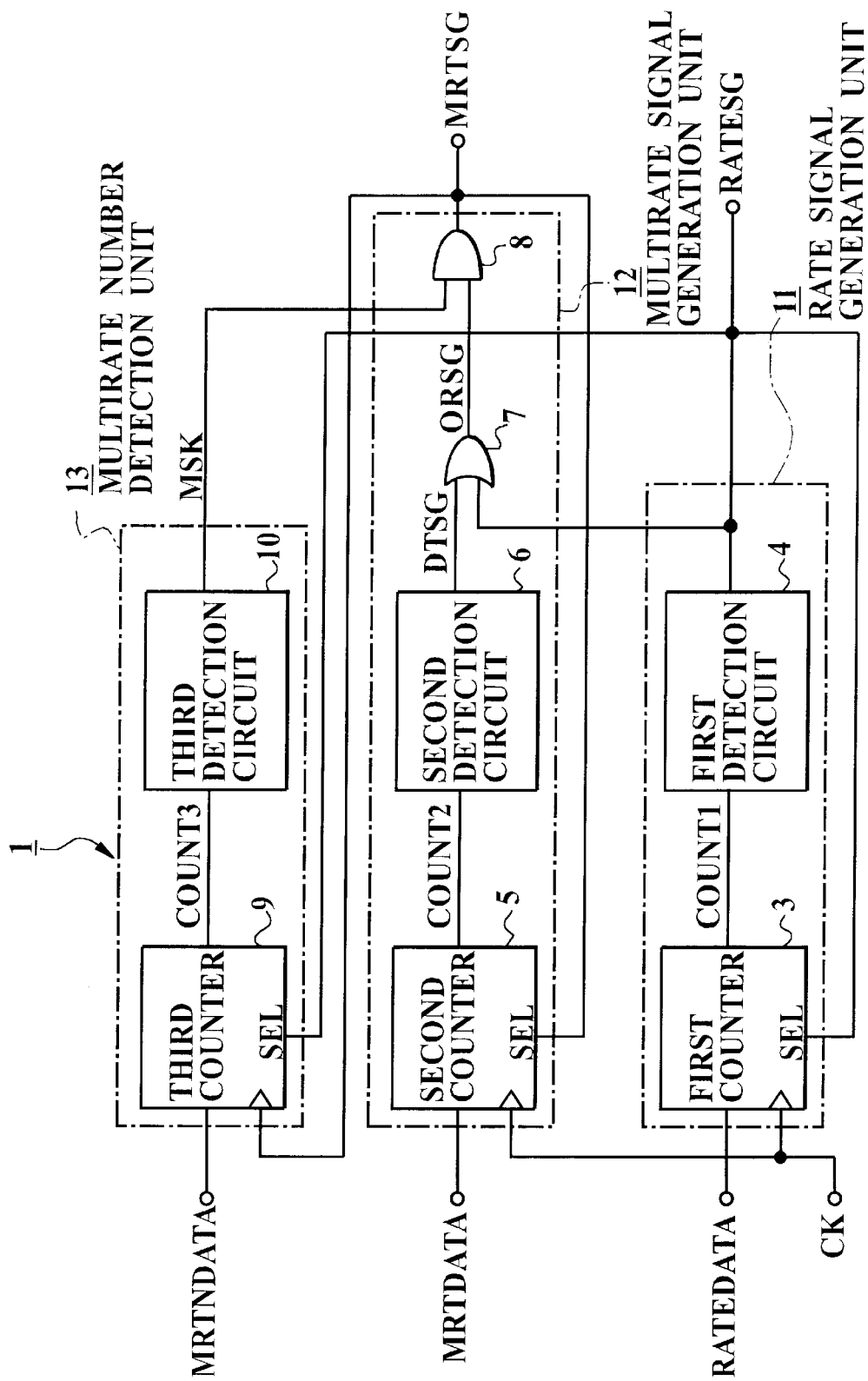
FIG. 1 is a block diagram showing the arrangement of a multirate generator according to the invention.
Figure 3:
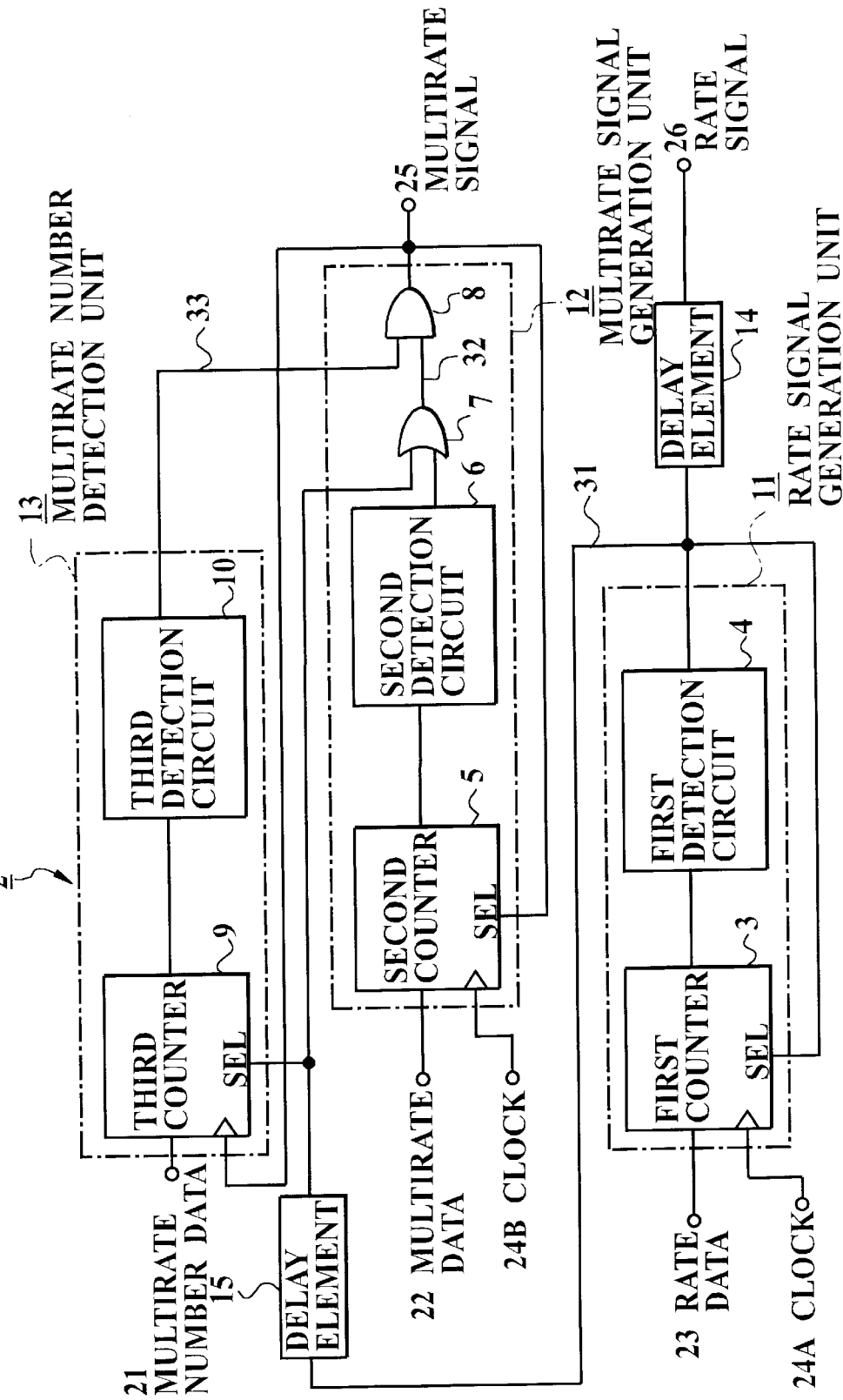
FIG. 3 is a block diagram showing the circuit arrangement of a multirate generator according to the prior art.

FIG. 1 is a block diagram showing an embodiment of a multirate generator to which a multirate generator and a multirate generating method, according to the present invention are applied. In FIG. 1, to structural members, elements or the like corresponding to those shown in FIG. 3, the same reference numerals are attached, and the detailed explanation for them is properly omitted.

As shown in FIG. 1, the multirate generator 1 comprises a rate signal generation unit 11 for generating a rate signal RATESG on the basis of inputted rate data RATEDATA, a multirate number detection unit 13 for generating a mask signal MSK on the basis of inputted multirate number data MRTNDATA, a multirate signal generation unit 12 for generating a multirate signal MRTSG on the basis of inputted multirate data MRTDATA and the mask signal MSK, and the like.

The rate generation unit 11 is composed of a first counter 3 and a first detection circuit 4, and generates and outputs a rate signal RATESG on the basis of inputted rate data RATEDATA.

The first counter 3 has a mode set on the basis of a rate signal RATESG inputted from the first detection circuit 4 to an SEL terminal, and has a load mode set in case that the inputted rate signal RATESG is at level "H" and has a count mode set in case that the inputted rate signal RATESG is at level "L". That is to say, the first counter 3 loads rate data RATEDATA for specifying the period of a rate signal RATESG in a load mode, and in a count mode, counts down the loaded rate data RATEDATA on the basis of the timing of an inputted clock CK and outputs the obtained count value COUNT1 to the first detection circuit 4.

The first detection circuit 4 outputs a rate signal RATESG which comes to be at level "H" in case of detecting that the count value COUNT1 inputted from the first counter 3 has become "0", to the outside, an OR gate 7 of the multirate signal generation unit 12, an SEL terminal of the first counter 3 in order to load the next rate data RATEDATA, and an SEL terminal of the third counter 9 of the multirate number detection unit 13 in order to load the next multirate number data MRTNDATA.

The multirate number detection unit 13 is composed of the third counter 9 and a third detection circuit 10, and generates and outputs a mask signal MSK on the basis of inputted multirate number data MRTNDATA.

The third counter 9 has a mode set on the basis of a rate signal RATESG inputted from the rate signal generation unit 11 to the SEL terminal, and has a load mode set in case that the inputted rate signal RATESG is at level "H" and has a count mode set in case that the inputted rate signal RATESG is at level "L". That is to say, the third counter 9 loads multirate number data MRTNDATA for specifying a subrate number (pulse number) of a multirate signal contained in one period of a rate signal RATESG in a load mode, and on the other hand, in a count mode, counts down the loaded multirate number data MRTNDATA on the basis of the timing of a multirate signal MRTSG inputted from the multirate signal generation unit 12 and outputs the obtained count value COUNT3 to the third detection circuit 10.

The third detection circuit 10 outputs a mask signal MSK which comes to be at level "H" in case of detecting that a count value 3 inputted from the third counter 9 has become "0" to an AND gate 8 of the multirate signal generation unit 12.

The multirate signal generation unit 12 is composed of a second counter 5, a second detection unit 6, an OR gate, the AND gate 8 and the like, and generates and outputs a multirate signal MRTSG on the basis of inputted multirate data MRTDATA and a mask signal MSK.

The second counter 5 has a mode set on the basis of a multirate signal MRTSG inputted to an SEL terminal, and has a load mode set in case that the inputted multirate signal MRTSG is at level "H" and has a count mode set in case that the multirate signal MRTSG is at level "L". That is to say, the second counter 5 loads multirate data MRTDATA for specifying a subrate period of a multirate signal MRTSG in a load mode, and on the other hand in a count mode, counts down the loaded multirate data MRTDATA on the basis of an inputted clock signal CK and outputs the obtained count value COUNT2 to the second detection circuit 6.

The second detection circuit 6 outputs a detection signal DTSG which comes to be at level "H" in case of detecting that a count value COUNT2 inputted from the second counter 5 has become "0" to the OR gate 7.

The OR gate 7 makes the OR of a rate signal RATESG inputted from the rate signal generation unit 11 and a detection signal DTSG, and outputs the obtained OR signal ORSG to the AND gate 8.

The AND gate 8 makes the AND of the inputted OR signal ORSG and a mask signal MSK inputted from the multirate number detection unit 13, and outputs the AND signal as a multirate signal MRTSG to the outside, a CLK terminal of the second counter 5 in order to load the next multirate data MRTDATA, and the SEL terminal of the third counter 9 of the multirate number detection unit 13.

Next, the operation of the apparatus will be described.

Figure 2:
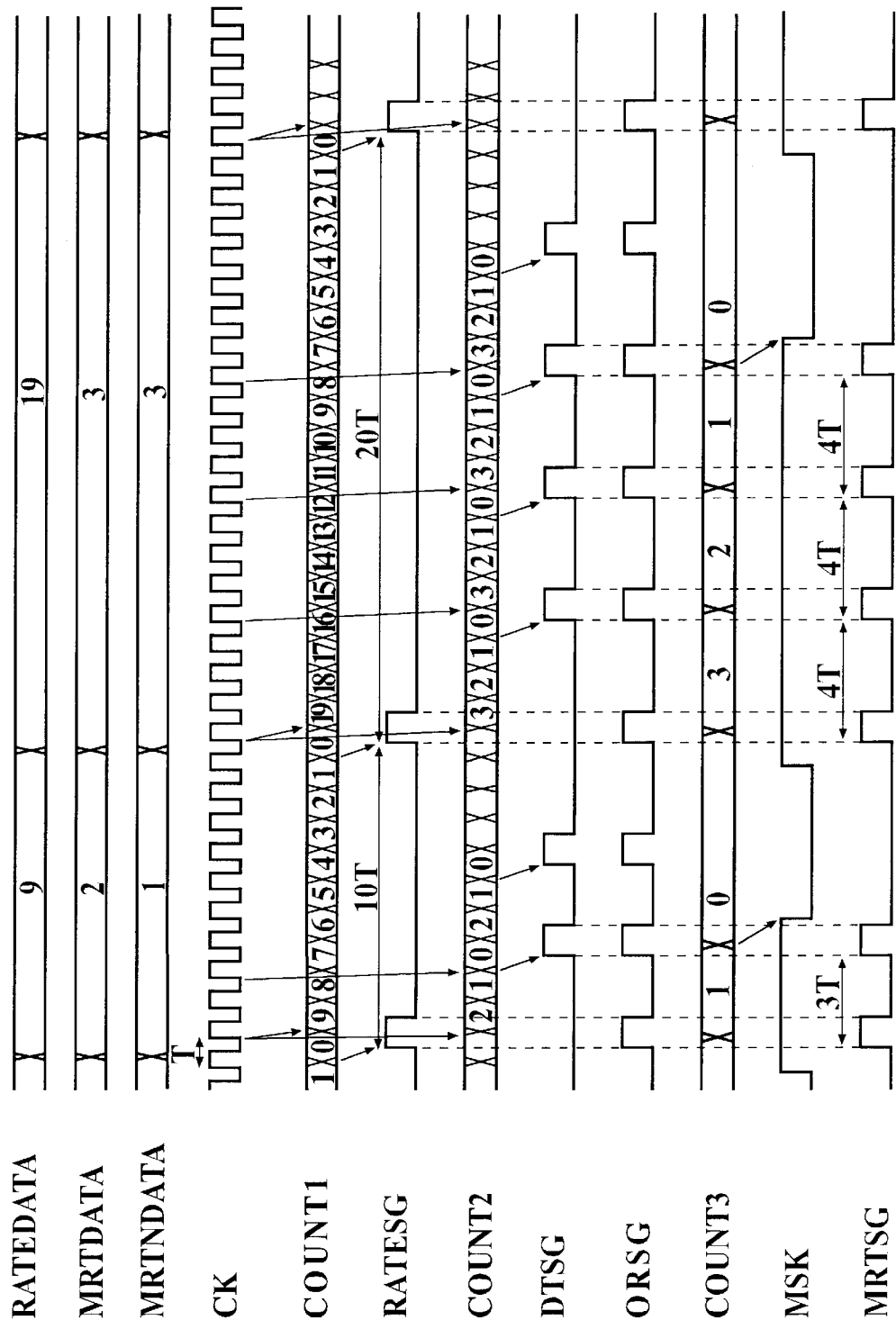
FIG. 2 is a timing chart for explaining operation of the multirate generator of FIG. 1.

FIG. 2 is an example of a timing chart of the multirate generator shown in FIG. 1. In FIG. 2, RATEDATA denotes a waveform of rate data, MRTDATA denotes a waveform of multirate data, MRTNDATA denotes a waveform of multirate number data, CK denotes a waveform of a clock, COUNT1 denotes a waveform diagram of a count value outputted from the first counter 3, RATESG denotes a waveform of a rate signal, COUNT2 denotes a waveform of a count value outputted from the second counter 5, DTSG denotes a waveform of a detection signal outputted from the second detection circuit 6, ORSG denotes a waveform of an OR signal outputted from the OR gate 7, COUNT3 denotes a waveform of a count value outputted from the third counter 9, MSK denotes a waveform of a mask signal, and MRTSG denotes a waveform of a multirate signal.

Operation of the multirate generator of FIG. 1 is described on the basis of the timing chart shown in FIG. 2, as follows.

As shown in this timing chart of FIG. 2, data "9", "19" and so on as rate data RATEDATA, data "2", "3" and so on as multirate data MRTDATA, and data "1", "3" and so on as multirate number data MRTNDATA are inputted, into the first counter 3 of the rate signal generation unit 11, the second counter 5 of the multirate signal generation unit 12, and the third counter 9 of the multirate number detection unit 13, in order, respectively. In this embodiment, since each of the first to third detection circuits 4, 6 and 10 detects "0" of a count value, a value smaller than a target value by "1" is set as each of the above-mentioned data. That is to say, the above-mentioned data, respectively, specify the period of a rate signal RATESG as "10T", "20T" and so on, the subrate period of a multirate signal MRTSG as "3T", "4T" and so on, and the subrate number of the multirate signal MRTSG as "2", "4" and so on. Rate data RATEDATA, multirate data MRTDATA and multirate number data MRTNDATA can be optionally set.

First, as shown in FIG. 2, the first counter 3 of the rate signal generation unit 11 loads rate data RATEDATA "9", "19" and so on one after another, each time the rate signal RATESG inputted from the first detection circuit 4 to the SEL terminal comes to be at level "H" and a load mode is set. On the other hand, when an inputted rate signal RATESG comes to be at level "L" and a count mode is set, the first counter 5 counts down the loaded rate data RATEDATA "9", "19" and so on at the timing of the clock CK and outputs an obtained count value COUNT1 to the first detection circuit 4. The first detection circuit 4 of the rate signal generation unit 11 outputs a rate signal RATESG as shown in FIG. 2 which comes to be at level "H" in case of detecting that a count value COUNT1 inputted from the first counter 3 has become "0" to the outside, the SEL terminal of the first counter 3, the SEL terminal of the third counter 9 of the multirate number detection unit 13, and the OR gate 7 of the multirate signal generation unit 12.

The third counter 9 of the multirate number detection unit 13 loads one after another multirate number data MRTNDATA "1", "3" and so on, each time a rate signal RATESG inputted from the first detection circuit 4 of the rate signal generation unit 11 to the SEL terminal comes to be at level "H" and a load mode is set. On the other hand, the third counter 9 counts down the loaded multirate number data MRTDATA "1", "3" and so on at the timing of the multirate signal MRTSG inputted from the multirate signal generation unit 12, and outputs the obtained count values COUNT3 to the third detection circuit 10, when the rate signal RATESG comes to be at level "L" and a count mode is set. The third detection circuit 10 of the multirate number detection unit 13 outputs a mask signal MSK which comes to be at level "L" in case of detecting that the count value COUNT3 has become "0" to the AND gate circuit 8 of the multirate signal generation unit 12.

The second counter 5 of the multirate signal generation unit 12 loads one after another multirate data MRTDATA "2", "2", "3", "3", "3", "3", and so on, each time a multirate signal MRTSG inputted from the AND gate 8 of the multirate signal generation unit 12 to the SEL terminal comes to be at level "H" and a load mode is set. On the other hand, the second counter 5 counts down the loaded multirate data MRTDATA "2", "2", "3", "3", "3", "3", and so on at the timing of the clock CK, and outputs the obtained count values COUNT2 to the second detection circuit 6, when the multirate signal MRTSG comes to be at level "L" and a count mode is set. The second detection circuit 6 of the multirate signal generation unit 12 outputs a detection signal DTSG which comes to be at level "H" in case of detecting that the count value COUNT2 has become "0" to the OR gate circuit 7.

The OR gate 7 makes the OR of a rate signal RATESG inputted from the rate signal generation unit 11 and an inputted detection signal DTSG, and outputs the OR signal ORSG to the AND gate 8. Such an OR signal ORSG shows the period of a subrate (pulse) of the multirate signal MRTSG. The AND gate 8 makes the AND of an OR signal inputted from the OR gate 7 and a mask signal MSK inputted from the multirate number detection unit 13, and outputs the AND as a multirate signal MRTSG.

That is to say, the AND gate 8 masks an OR signal ORSG with a mask signal MSK and outputs a multirate signal MRTSG having a subrate number (pulse number) corresponding to a multirate number data MRTNDATA, until the subrate number (pulse number) of the OR signal ORSG inputted from the OR gate 7 for each period of the rate signal RATESG reaches the multirate number data MRTNDATA.

Concretely, a multirate signal having a subrate period "3T", "4T". or the like, respectively, at a subrate number "2", "4" or the like is outputted for each of periods "10T", "20T", and so on of the rate signal RATESG.

As described above, since the embodiment operates the rate signal generation unit 11 and the multirate generation unit 12 by means of the same clock and makes the rate signal generation unit 11 and the multirate generation unit 12 generate, respectively, a rate signal RATESG and a multirate signal MRTSG, it is possible to generate a rate signal RATESG and a multirate signal MRTSG which have been timing-adjusted without using delay elements and the like, and it is possible to provide a multirate generator and a multirate generating method at a low cost without requiring a timing adjustment.

And since the embodiment makes it possible to optionally set up rate data RATEDATA, multirate data MRTDATA and multirate number data MRTNDATA, it is possible for an operator to set up optionally the period of a rate signal and the subrate period and the subrate number (pulse number) of a multirate signal, and output a desired rate signal RATESG and a desired multirate signal MRTSG.

The above-mentioned timing chart is only an example, and any timing can be used which makes the present invention feasible.

Since a multirate generator according to the invention operates a rate signal generating means and a multirate signal generating means by means of the same clock, and makes the rate signal generating means and the multirate signal generating means generate, respectively, a rate signal and a multirate signal, it is possible to generate a rate signal and a multirate signal which have been timing-adjusted without using delay elements and the like, and it is possible to provide a low-cost multirate generator requiring no timing adjustment.

According to the multirate generator of the invention which operates a first counter means for generating a rate signal and a second counter means for generating a multirate signal by means of the same clock, and makes the first detecting means and the second detecting means and the like generate, respectively, a rate signal and a multirate signal; it is possible to generate a rate signal and a multirate signal which have been timing-adjusted with a simple circuitry and without using delay elements, and it is possible to provide a multirate generator having a low-cost and simple circuitry requires no timing adjustment.

According to the multirate generator which makes it possible to optionally set rate data, multirate data and multirate number data, in addition to the above-described effects of the invention, it is possible for an operator to set optionally the period of a rate signal, and the subrate period and the subrate number of a multirate signal, and output a desired rate signal and a desired multirate signal.

According to the multirate generating method of the invention, which operates a rate signal generating means and a multirate signal generating means by means of the same clock, and makes the rate signal generating means and the multirate signal generating means generate, respectively, a rate signal and a multirate signal, it is possible to generate a rate signal and a multirate signal which have been timing-adjusted without using delay elements and the like, and it is possible to provide a low-cost and feasible multirate generating method requiring no timing adjustment.

According to the multirate generating method according to the invention as claimed in claim 5 operates a means for generating a rate signal and a means for generating a multirate signal by means of the same clock, and makes them generate, respectively, a rate signal and a multirate signal, it is possible to generate a rate signal and a multirate signal which have been timing-adjusted with a simple circuitry and without using delay elements, and it is possible to provide a multirate generating method having a low-cost and simple circuitry requiring no timing adjustment.

According to the multirate generating method which makes it possible to optionally set rate data, multirate data and multirate number data, in addition to the advantageous effects of the invention as described above, it is possible for an operator to set optionally the period of a rate signal, and the subrate period and the subrate number of a multirate signal, and output a desired rate signal and a desired multirate signal.

What is claimed is:

1. A multirate generator for generating a rate signal and a multirate signal having a subrate period and a subrate number which are set for each period of the rate signal, the multirate generator comprising:

a rate signal generation unit which takes the rate signal as a mode selection input, and in a load mode, counts down rate data to specify a period with which the rate signal is to be generated on the basis of a timing of an inputted clock, and generates a rate signal which comes to be at a predetermined level each time an obtained first count value becomes a predetermined value;

a multirate signal generation unit which takes the multirate signal as a mode selection input, and in a load mode, counts down multirate data to specify a subrate period with which the multirate signal is to be generated on the basis of a timing of the inputted clock, outputs a detection signal by detecting that an obtained second count value becomes a predetermined value, makes the OR signal of the detection signal and the rate signal, and generates the multirate signal obtained by masking the OR signal with a mask signal; and a multirate number detection unit which takes the rate signal as a mode selection input, and in a load mode, counts down multirate number data to specify a multirate number of the multirate signal to be generated on the basis of a timing of the multirate signal, detects that an obtained third count value becomes a predetermined value, and outputs the detection signal as the mask signal.

2. A multirate generator for generating a rate signal and a multirate signal having a subrate period and a subrate number which are set for each period of the rate signal, the multirate generator comprising:

a first counter which takes the rate signal as a mode selection input, and in a load mode, counts down rate data to specify a period with which the rate signal is to be generated on the basis of a timing of an inputted clock, and outputs an obtained first count value;

a first detection circuit which outputs a rate signal which comes to be at a specified level each time the first count value becomes a specified value;

a second counter which takes the multirate signal as a mode selection input, and in a load mode, counts down multirate data to specify a subrate period with which the multirate signal is to be generated on the basis of a timing of the inputted clock, and outputs an obtained second count value;

a second detection circuit which detects that the second count value becomes a specified value and outputs it as a detection signal;

an OR gate which makes and outputs an OR signal of the detection signal and the rate signal;

an AND gate which makes an AND of the OR signal and a mask signal and outputs it as the multirate signal;

a third counter which takes the rate signal as a mode selection input, and in a load mode, counts down multirate data to specify a subrate number of the multirate signal to be generated on the basis of a timing of the multirate signal, and outputs an obtained third count value; and a third detection circuit which detects that the third count value becomes a predetermined value and outputs it as the mask signal.

3. A multirate generator as claimed in claim 1, wherein the rate data, the multirate data and the multirate number data can be optionally set.

4. A multirate generator as claimed in claim 2, wherein the rate data, the multirate data and the multirate number data can be optionally set.

5. A multirate generating method for generating a rate signal and a multirate signal having a subrate period and a subrate number which are set for each period of the rate signal, the multirate generating method comprising the steps of:

taking the rate signal as a mode selection input, and in a load mode, counting down rate data to specify a period with which the rate signal is to be generated on the basis of a timing of an inputted clock, and generating a rate signal which comes to be at a predetermined level each time an obtained first count value becomes a predetermined value;

taking the rate signal as a mode selection input, and in a load mode, counting down multirate number data to specify a subrate number of the multirate signal to be generated on the basis of a timing of the multirate signal, detecting that an obtained third count value becomes a predetermined value, and outputting it as a mask signal; and taking the multirate signal as a mode selection input, and in a load mode, counting down multirate data to specify a subrate period with which the multirate signal is to be generated on the basis of a timing of the inputted clock, outputting a detection signal by detecting that an obtained second count value becomes a predetermined value, making an OR signal of the detection signal and the rate signal, making an AND of the OR signal and the mask signal, and generating it as the multirate signal.

6. A multirate generating method for generating a rate signal and a multirate signal having a subrate period and a subrate number which are set for each period of the rate signal, the multirate generating method comprising the steps of:

taking the rate signal as a mode selection input, and in a load mode, counting down rate data to specify a period with which the rate signal is to be generated on the basis of a timing of an inputted clock, and outputting an obtained first count value;

outputting a rate signal which comes to be at a predetermined level each time the first count value becomes a predetermined value;

taking the rate signal as a mode selection input, and in a load mode, counting down multirate number data to specify a subrate number of the multirate signal to be generated on the basis of a timing of the multirate signal, and outputting an obtained third count value;

detecting that the third count value becomes a predetermined value and outputting it as a mask signal;

taking the multirate signal as a mode selection input, and in a load mode, counting down multirate data to specify a subrate period with which the multirate signal is to be generated on the basis of a timing of the inputted clock, and outputting an obtained second count value;

detecting that the second count value becomes a predetermined value and outputting the detection signal;

generating and outputting an OR signal of the detection signal and the rate signal; and making the OR of an AND signal and the mask signal and outputting it as the multirate signal.

7. A multirate generating method as claimed in claim 5, wherein the rate data, the multirate data and the multirate number data can be optionally set.

8. A multirate generating method as claimed in claim 6, wherein the rate data, the multirate data and the multirate number data can be optionally set.

* * * * *

UNITED STATES PATENT AND TRADEMARK OFFICE
CERTIFICATE OF CORRECTION

PATENT NO. : 5,854,798
DATED : December 29, 1998
INVENTOR(S) : UEHARA

It is certified that error appears in the above-identified patent and that said Letters Patent is hereby corrected as shown below:

On the title page,
　　Please add:

--[30] Foreign Application Priority Data

Jan. 28, 1997 [JP] Japan.... 9-14210--.

Signed and Sealed this

Third Day of August, 1999

Attest:

Q. TODD DICKINSON

*Attesting Officer*　　　*Acting Commissioner of Patents and Trademarks*